(12) United States Patent
Fukuda

(10) Patent No.: US 7,790,506 B2
(45) Date of Patent: Sep. 7, 2010

(54) METHOD OF MANUFACTURING SEMICONDUCTOR DEVICES ENCAPSULATED IN CHIP SIZE PACKAGES

(75) Inventor: Yoshio Fukuda, Ebino (JP)

(73) Assignee: Yamaha Corporation, Shizuoka-Ken (JP)

(*) Notice: Subject to any disclaimer, the term of this patent is extended or adjusted under 35 U.S.C. 154(b) by 79 days.

(21) Appl. No.: 12/001,307

(22) Filed: Dec. 11, 2007

(65) Prior Publication Data

US 2008/0197455 A1 Aug. 21, 2008

(30) Foreign Application Priority Data

Dec. 13, 2006 (JP) ............... 2006-335688

(51) Int. Cl.
*H01L 21/00* (2006.01)
*H01L 23/544* (2006.01)
*H01L 23/48* (2006.01)

(52) U.S. Cl. ............... 438/113; 438/108; 438/110; 438/114; 438/115; 438/462; 438/464; 257/620; 257/773; 257/E21.599

(58) Field of Classification Search ............... 438/113, 438/114, 462
See application file for complete search history.

(56) References Cited

U.S. PATENT DOCUMENTS 6,780,746 B2 * 8/2004 Kinsman et al. ............... 438/612

2001/0042902 A1 * 11/2001 Wakabayashi et al. ...... 257/620
2005/0095750 A1 * 5/2005 Lo et al. ............... 438/114
2006/0049488 A1 3/2006 Uchida
2006/0214294 A1 * 9/2006 Fukasawa ............... 257/738
2006/0244149 A1 11/2006 Nakamura et al.

FOREIGN PATENT DOCUMENTS

| JP | 2000-243729 | 9/2000 |
| JP | 2001-127206 | 5/2001 |
| JP | 2001-144121 | 5/2001 |
| JP | 2006-80284 | 3/2006 |
| JP | 2006-261299 | 9/2006 |
| KR | 10-2000-0058170 A | 9/2000 |

* cited by examiner

*Primary Examiner*—N Drew Richards
*Assistant Examiner*—Michael Jung
(74) *Attorney, Agent, or Firm*—Dickstein Shapiro LLP

(57) ABSTRACT

A semiconductor device having a rectangular exterior appearance includes a substrate for arranging an integrated circuit on the surface thereof, at least one rewire electrically connected to the integrated circuit via at least one pad electrode, at least one electrode terminal formed on the rewire, and a resin layer for completely sealing the substrate including the rewire such that the electrode terminal be exposed to the exterior. Slopes are formed at the corners between the backside and the side faces of the resin layer; and other slopes are further formed at the corners between the surface and the side faces of the resin layer. Thus, it is possible to reliably prevent the semiconductor device sealed with the resin layer from chipping or peeling irrespective of an impact occurring at the corners of the resin layer.

4 Claims, 5 Drawing Sheets

METHOD OF MANUFACTURING SEMICONDUCTOR DEVICES ENCAPSULATED IN CHIP SIZE PACKAGES

BACKGROUND OF THE INVENTION

1. Field of the Invention

The present invention relates to semiconductor devices encapsulated in chip size packages and manufacturing methods therefor.

This application claims priority on Japanese Patent Application No. 2006-335688, the content of which is incorporated herein by reference.

2. Description of the Related Art

Accompanied with recent improvements of electronic devices such as portable terminal devices, which are designed to realize multiple functions and highly-sophisticated functions, it is strongly demanded that semiconductor devices not only be reduced in size and dimension but also capable of performing high-speed processing. Semiconductor devices encapsulated in wafer-level chip size packages (WL-CSP) have attracted attention in recent times. In the manufacturing of semiconductor devices each encapsulated in WL-CSP, re-wirings and electrode terminals are formed at the wafer level, and ICs formed on the surface of a wafer are subjected to resin sealing (or packaging) in order to protect them from heat, light, and physical impact at the wafer level; then, the wafer is divided into individual pieces in the final stage. Thus, it is possible to make the dimensions of semiconductor devices after being packaged substantially match the dimensions of IC chips. This makes it possible to realize a remarkable downsizing of semiconductor devices.

Conventionally-known semiconductor devices each encapsulated in WL-CSP are not always designed such that only the surface of a substrate (i.e., an individual piece divided from a wafer) is sealed with a resin. For example, Japanese Unexamined Patent Application Publication No. 2000-243729 teaches a semiconductor device whose side areas are also sealed with a resin; and Japanese Unexamined Patent Application Publication No. 2001-144121 teaches a semiconductor device whose side areas and backside are also sealed with a resin. Each of the aforementioned technologies is designed to protect a substrate by sealing defects such as chipping, which occur during dicing, with a resin; hence, it is possible to reduce defects or to reduce defects in size in the semiconductor device.

However, when an intense impact occurs at the corners of the aforementioned semiconductor device, the resin coating the substrate partially chips or partially peels, and the substrate is partially exposed to the surface. For this reason, it is necessary to carefully handle them during transportation or during installation into electronic devices. That is, the aforementioned technologies suffer from disadvantages in terms of high-speed transportation and high-speed installation.

SUMMARY OF THE INVENTION

It is an object of the present invention to provide a semiconductor device that can be easily handled during transportation and installation and in which the resin coating the substrate hardly chips or peels.

It is another object of the present invention to provide a manufacturing method of the semiconductor device.

In a first aspect of the present invention, a semiconductor device having a rectangular exterior appearance includes a substrate having a surface for arranging an integrated circuit, at least one rewire that is electrically connected to the integrated circuit via at least one pad electrode, at least one electrode terminal formed on the rewire, and a resin layer, which entirely seals the substrate including the rewire in such a way that the electrode terminal is exposed to the exterior, wherein the resin layer has a plurality of slopes that are formed at the corners between the backside and the side faces of the resin layer. It is possible to further form other slopes at the corners of the resin layer between the surface and the side faces of the resin layer.

Due to the formation of the slopes (or inclines) that incline from the backside of the resin layer, it is possible to reliably prevent the resin layer sealing the backside of the substrate from chipping or peeling irrespective of an impact occurring at the corners of the resin layer in the semiconductor device. During the transportation of the semiconductor device by use of a collet for absorbing and holding the backside of the substrate not forming the electrode terminals, it is possible to reliably prevent the resin layer from chipping or peeling even when the collet collides with the corners of the resin layer. Due to the formation of the slopes (or inclines) that incline from the surface of the resin layer, it is possible to reliably prevent the resin layer sealing the surface of the substrate from chipping or peeling; hence, it is possible to reliably prevent the rewires and electrode terminals from being unexpectedly exposed to the exterior and from being unexpectedly damaged.

In addition, it is possible to form slopes at the corners between the backside and the side faces of the substrate in correspondence with the aforementioned slopes of the resin layer. It is also possible to form other slopes at the corners between the surface and the side faces of the substrate in correspondence with the other slopes of the resin layer. Due to the formation of the slopes (and other slopes) of the substrate, it is possible to secure adequate thickness of the resin layer at its corners; hence, it is possible to reliably protect the substrate by means of the resin layer.

In the above, the resin layer is constituted of a first resin layer for sealing the backside of the substrate and a second resin layer for sealing the surface and the side faces of the substrate, and wherein the aforementioned slopes of the resin layer are formed with respect to both of the first resin layer and the second resin layer. That is, even when an impact occurs at the corners between the backside and the side faces of the resin layer, it is possible to prevent stress from concentrating at the boundaries between the first resin layer and the second resin layer; hence, it is possible to effectively prevent the first resin layer from peeling from the second resin layer.

In a second aspect of the present invention, there is provided a manufacturing method adapted to a semiconductor device, in which a wafer is provided having a surface, on which a plurality of integrated circuits are formed and electrically connected to a plurality of rewires via a plurality of pad electrodes, and in which a plurality of electrode terminals are formed on the rewires, and then the wafer is divided into a plurality of individual pieces. Herein, a first resin layer is formed to seal the backside of the wafer before and after the formation of the rewires and the electrode terminals; primary dicing is performed on the surface of the wafer toward the backside of the wafer after the formation of the rewires, and the electrode terminals, and the first resin layer so that the first resin layer is partially cut out, thus forming a plurality of dicing channels partitioning the integrated circuits; a second resin layer is formed to seal the dicing channels and the surface of the wafer after the formation of the dicing channels; the backside of the wafer is subjected to dicing so as to form a plurality of V-shaped channels in the first resin layer after the formation of the first and second resin layers in such a way that the V-shaped channels overlap the dicing channels in the thickness direction of the wafer; then, secondary dicing is performed in such a way that the second resin layer sealing the side faces of the wafer subjected to partitioning due to the primary dicing still remains and in such a way that the V-shaped channels partially remain forming a plurality of slopes, which are inclined from the backside of the first resin layer sealing the backside of the wafer, thus dividing the wafer into individual pieces.

In the above, a plurality of V-shaped channels are further formed in the second resin layer by way of dicing performed on the surface of the wafer so as to overlap the dicing channels after the formation of the second resin layer and before the secondary dicing, wherein the V-shaped channels formed in the second resin layer partially remain by way of the secondary dicing, thus forming a plurality of slopes that are inclined from the surface of the second resin layer sealing the surface of the wafer.

As described above, the slopes are formed at the corners of the first resin layer sealing the backside of the substrate and at the corners of the second resin layer sealing the surface of the substrate; hence, it is possible to reliably prevent the resin layer from chipping or peeling irrespective of an impact occurring at the corners of the first and second resin layer.

Furthermore, it is possible to form a plurality V-shaped channels in the backside of the wafer before the formation of the first resin layer in such a way that the V-shaped channels formed in the backside of the wafer overlap the V-shaped channels formed in the first resin layer in the thickness direction of the wafer, wherein the V-shaped channels formed in the backside of the wafer are sealed with the first resin layer together with the backside of the wafer. Herein, the V-shaped channels formed in the backside of the wafer partially remain by way of the secondary dicing so as to form slopes that overlap the slopes of the first resin layer in the thickness direction of the wafer. This makes it possible to secure adequate thickness of the resin layer at the corners of the first resin layer forming the slopes; hence, it is possible to reliably protect the substrate by means of the resin layer.

As described above, due to the formation of the slopes at the corners of the resin layer, it is possible to reliably prevent the resin layer from chipping or peeling irrespective of an impact occurring at the corners. This makes it easy to handle the semiconductor device during transportation and during installation into an electronic device. Thus, it is possible to realize high-speed transportation and high-speed installation with respect to the semiconductor device of the present invention.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENT

The present invention will be described in further detail by way of examples with reference to the accompanying drawings.

In accordance with a preferred embodiment of the present invention, a semiconductor device 1 and a manufacturing method thereof will be described in detail with reference to FIGS. 1 to 7. The semiconductor device 1 is designed such that it can be installed in a portable terminal device or another electronic device. In particular, the semiconductor device 1 is encapsulated in WL-CSP subjected to re-wiring and resin sealing at the wafer level.

Figure 1:
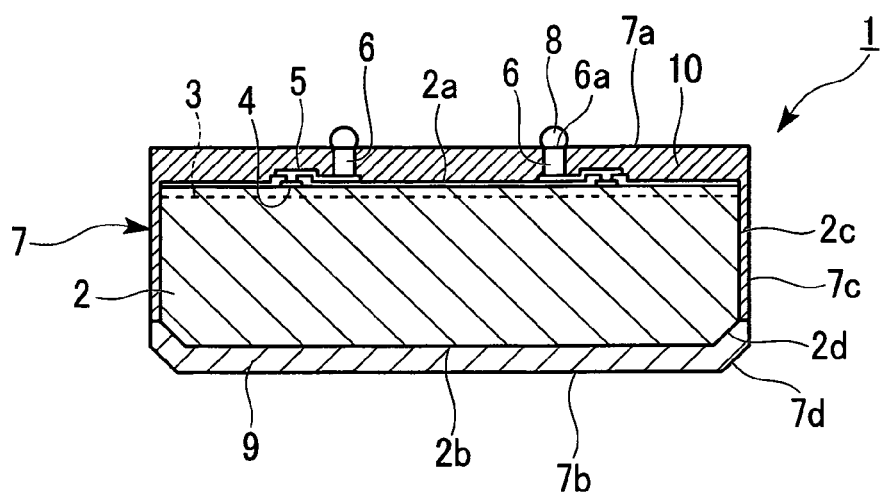
FIG. 1 is a cross-sectional view showing the constitution of a semiconductor device in accordance with a preferred embodiment of the present invention.

As shown in FIG. 1, the semiconductor device 1 has a rectangular exterior appearance, wherein it includes a thin rectangular substrate 2 (or an individual piece derived from a wafer) having a surface 2a for arranging an integrated circuit 3 thereon, rewires 5 electrically connected to the integrated circuit 3 via pad electrodes 4, pillared electrode terminals (or metal posts) 6 formed on the rewires 5, and a resin layer 7, which completely seals the substrate 2 including the rewires 5 in such a way that upper surfaces 6a of the electrode terminals 6 are exposed to the exterior. The semiconductor device 1 also includes projected electrodes (or bumps) 8, which project upwardly from the upper surfaces 6a of the electrode terminals 6.

Side faces 2c (which are defined by primary dicing) of the substrate 2 lie substantially perpendicular to the surface 2a and a backside 2b (which is positioned opposite to the surface 2a). Slopes (or inclines) 2d, which are inclined from the backside 2b to the side faces 2c of the substrate 2, are formed at the corners between the backside 2b and the side faces 2c of the substrate 2.

The resin layer 7 has a surface 7a, a backside 7b, and side faces 7c, which are formed substantially in parallel with the surface 2a, the backside 2b, and the side faces 2c of the substrate 2. The thickness of the resin layer 7 sealing the surface 2a of the substrate 2 is determined in such a way that the surface 7a forms on substantially the same plane as the upper surfaces 6a of the metal posts 6. In addition, slopes (or inclines) 7d, which are inclined from the backside 7b to the side faces 7c of the resin layer 7, are formed at the corners between the backside 7b of the resin layer 7 (sealing the backside 2b of the substrate 2) and the side faces 7c of the resin layer 7 (sealing the side faces 2c of the substrate 2). The slopes 7d of the resin layer 7 are formed in correspondence with the slopes 2d of the substrate 2, wherein it is preferable that the slopes 7d and the slopes 2d be formed in parallel with each other.

The resin layer 7 is constituted of a first resin layer 9 sealing the backside 2b and the slopes 2d of the substrate 2 and a second resin layer 10 sealing the surface 2a and the side faces 2c of the substrate 2. The first resin layer 9 and the second resin layer 10 are formed independently of each other by way of a manufacturing method, which will be described later. For example, both are composed of an epoxy resin. The present embodiment is designed such that the slopes 7d are formed in the first resin layer 9 only, but they do not reach the second resin layer 10.

Next, the manufacturing method of the semiconductor device 1 having the aforementioned constitution will be described in detail.

Figure 2:
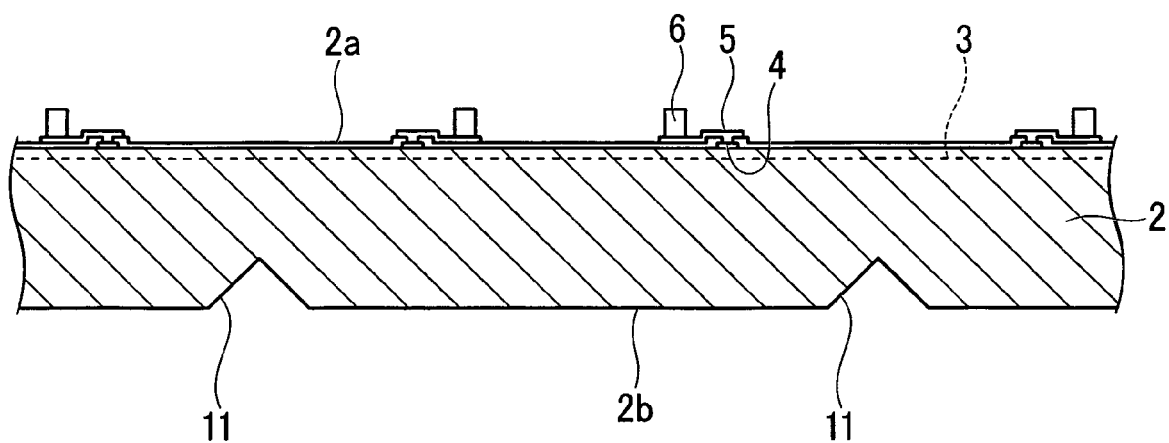
FIG. 2 is a longitudinal sectional view for explaining a first step of a manufacturing method of the semiconductor device, in which rewires and metal posts are formed on the surface of a wafer, and V-shaped channels are formed in the backside of the wafer.

First, a disk-shaped wafer 2 (corresponding to the substrate 2) is provided having a surface 2a (corresponding to the surface 2a of the substrate 2), on which a plurality of integrated circuits 3 are formed, and a backside 2b (corresponding to the backside 2b of the substrate 2) as shown in FIG. 2. The backside 2b of the wafer 2 is subjected to dicing along scribing lines for individually defining the integrated circuits 3, thus forming V-shaped channels 11, each of which has a V-shaped section having small depth. Next, the rewires 5 connected to the pad electrodes 4 are formed on the surface 2a of the wafer 2, and then the pillared metal posts 6 are formed on the rewires 5. The rewires 5 are formed by way of etching.

Figure 3:
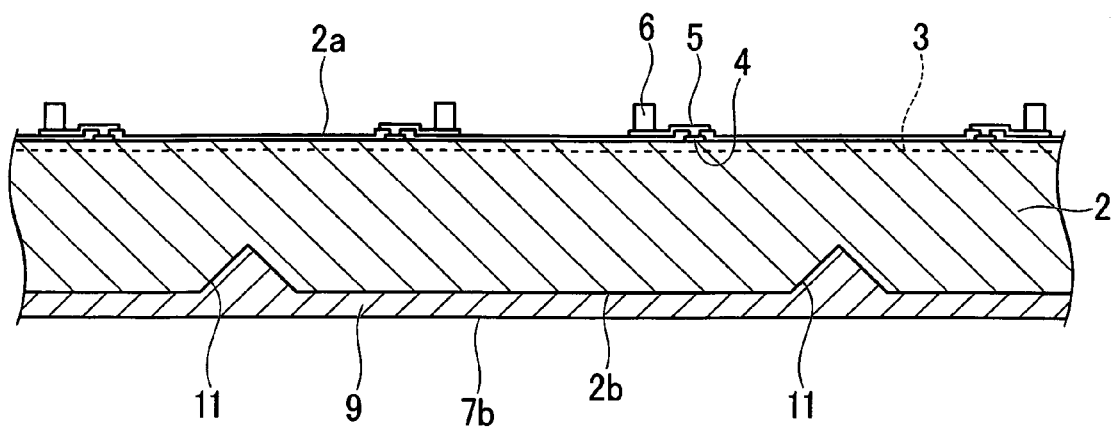
FIG. 3 is a longitudinal sectional view for explaining a second step of the manufacturing method of the semiconductor device, in which a first resin layer is formed on the backside of the wafer.

Next, as shown in FIG. 3, the first resin layer 9 is formed to seal the backside 2b of the wafer 2 and the V-shaped channels 11. Specifically, the wafer 2 is mounted on a resin sheet forming the first resin layer 9 such that the backside 2b thereof is positioned opposite to the resin sheet; then, the resin sheet is melted and is therefore attached to the backside 2b of the wafer 2, wherein the V-shaped channels 11 are filled with a melted resin. This makes it possible to easily position the backside 7b of the first resin layer 9 substantially in parallel with the backside 2b of the wafer 2.

Figure 4:
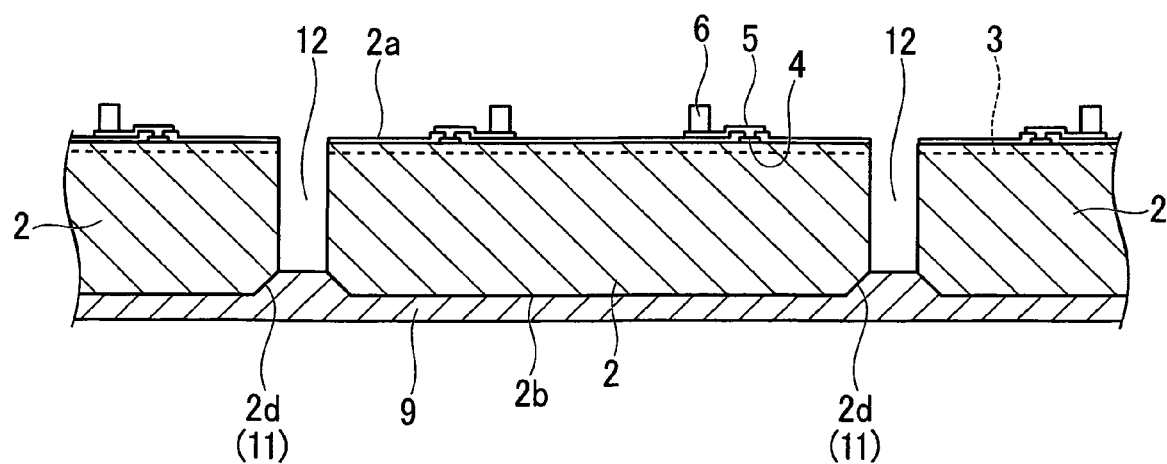
FIG. 4 is a longitudinal sectional view for explaining a third step of the manufacturing method of the semiconductor device, in which dicing channels are formed in the wafer by way of primary dicing.

After the formation of the first resin layer 9, as shown in FIG. 4, primary dicing is performed in a direction from the surface 2a to the backside 2b of the wafer 2 with a depth reaching prescribed parts of the first resin layer 9, thus forming dicing channels 12 partially overlapping the V-shaped channels 11 in the thickness direction of the wafer 2. Due to the primary dicing, the wafer 2 is divided into individual pieces each corresponding to the substrate 2 along the dicing channels 12, whereas a plurality of substrates 2 are integrally fixed together by means of the first resin layer 9.

The width of the dicing channel 12 is smaller than the width of the V-shaped channel 11. Herein, the dicing channel 12 is formed to cut out only the center portion of the V-shaped channel 11 in its width direction. The remaining portions of the V-shaped channels 11 form the slopes 2d of the substrate 2.

Figure 5:
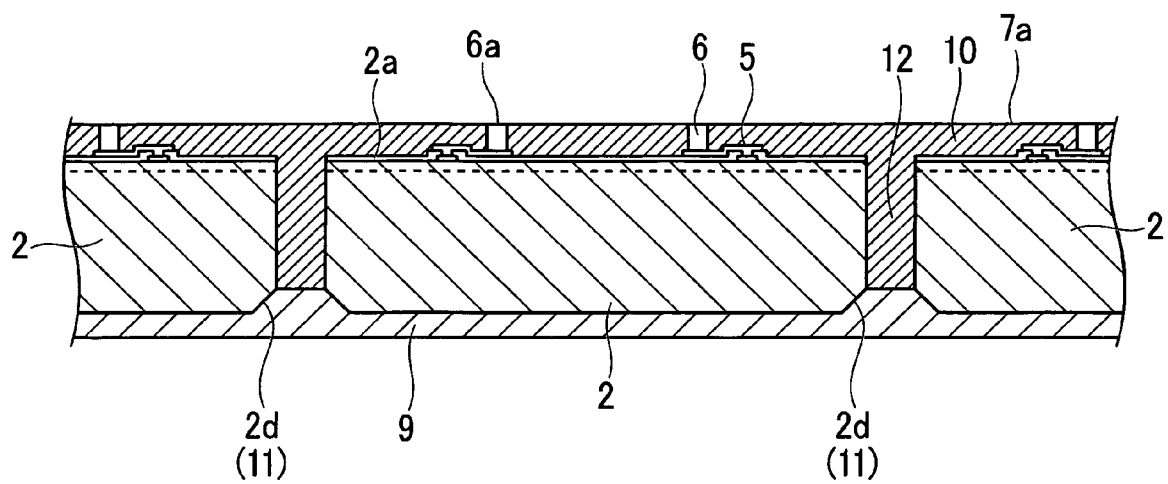
FIG. 5 is a longitudinal sectional view for explaining a fourth step of the manufacturing method of the semiconductor device, in which a second resin layer is formed on the surface of the wafer.

Next, as shown in FIG. 5, the second resin layer 10 is formed to continuously seal the dicing channels 12 and the surface 2a of the wafer 2 so that the surface 7a of the resin layer 7 lies in parallel with the surface 2a of the wafer 2. Herein, the dicing channels 12 are filled with the second resin layer 10, while the surface 2a of the wafer 2, the rewires 5, and the metal posts 6 are sealed with the second resin layer 10. Specifically, the metal posts 6 are completely embedded in the second resin layer 10 first, and then the second resin layer 10 is partially polished so as to expose the upper surface 6a of the metal posts 6 to the exterior.

Figure 6:
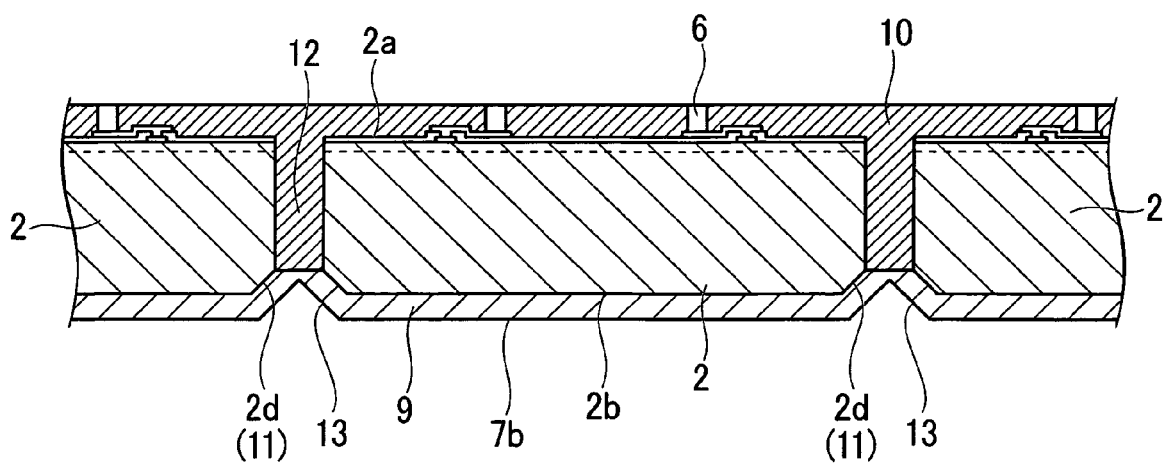
FIG. 6 is a longitudinal sectional view for explaining a fifth step of the manufacturing method of the semiconductor device, in which V-shaped channels are formed on the backside of the first resin layer.

After completion of the formation of the second resin layer 10, as shown in FIG. 6, the backside 2b of the wafer 2 is subjected to dicing so as to form V-shaped channels 13, each having a V-shaped section, on the backside 7b of the first resin layer 9, wherein the V-shaped channels 13 are positioned to overlap the dicing channels 12 and the remaining portions of the V-shaped channels 11 in the thickness direction of the wafer 2.

Figure 7:
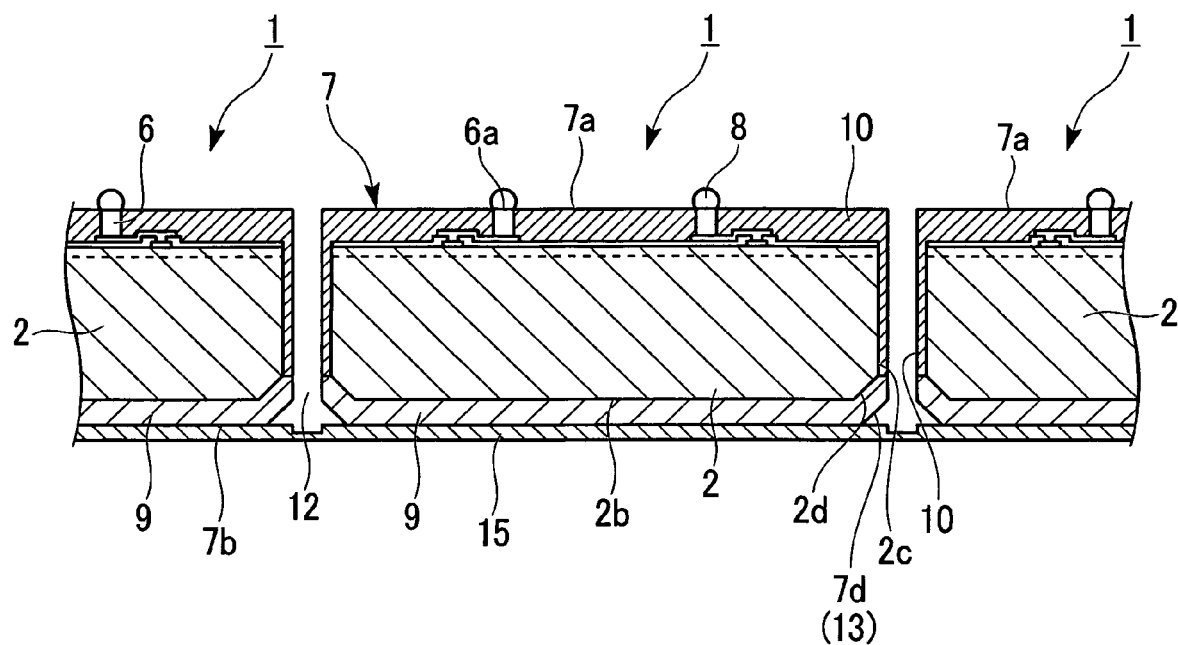
FIG. 7 is a longitudinal sectional view for explaining a sixth step of the manufacturing method of the semiconductor device, in which secondary dicing is performed so as to divide the wafer into individual pieces each corresponding to the semiconductor device.

Next, as shown in FIG. 7, the bumps 8 are attached onto the upper surfaces 6a of the metal posts 6, which are exposed on the surface 7a of the second resin layer 10. In addition, a dicing tape 15 is adhered to the backside 7b of the first resin layer 9 sealing the backside 2b of the wafer 2. Thereafter, secondary dicing is performed on the surface 2a of the wafer 2 (corresponding to the surface 7a of the second resin layer 10) so as to cut out the dicing channels 12 with a depth reaching prescribed parts of the dicing tape 15. In this stage, the wafer 2 is divided into individual pieces each corresponding to the semiconductor device 1.

The cut width due to the secondary dicing is smaller than the width of the dicing channel 12 and the width of the V-shaped channel 13, so that the second resin layer 10 partially remains on the interior wall of the dicing channel 12 so as to seal the side faces 2c of the substrate 2. Due to the secondary dicing, only the center portion of the V-shaped channel 13 in its width direction is cut out, so that the remaining portion of the V-shaped channel 13 forms the slopes 7d of the resin layer 7.

Lastly, the dicing tape 15 is pulled outwardly and is thus stretched, whereby the "individually divided" semiconductor device 1 is being isolated while still adhering to the dicing tape 15. Thus, it is possible to complete the manufacturing of the semiconductor device 1.

According to the semiconductor device 1 and its manufacturing method, the slopes 7d are formed at the corners between the backside 7b and the side faces 7c of the resin layer 7, whereby it is possible to reliably prevent the resin layer 7 from chipping off or peeling off irrespective of impact being applied to the corners. During transportation, a collet is used to absorb and hold the backside 7b of the semiconductor device 1 on which none of the metal posts 6 and the bumps 8 are formed, wherein even when the corners between the backside 7b and the side faces 7c of the resin layer 7 unexpectedly collide with the collet, it is possible to reliably prevent the resin layer 7 from chipping or peeling at the corners. This makes it easy to handle the semiconductor device 1 during transportation and during installation into an electronic device and the like. That is, it is possible to realize high-speed transportation and high-speed installation with respect to the semiconductor device 1.

In addition, the slopes 2d are formed on the corners of the backside 2b of the substrate 2 in correspondence with the slopes 7d of the backside 7b of the resin layer 7. This secures an adequate thickness of the resin layer 7 at the corners of the backside 7b of the resin layer 7; hence, it is possible to reliably protect the substrate 2 by means of the resin layer 7.

In the present embodiment, the first resin layer 9 is formed after the formation of the rewires 5 and the metal posts 6; but this is not a restriction. It is simply required that the first resin layer 9 be formed after the formation of the V-shaped channels 11. In other words, the rewires 5 and the metal posts 6 can be formed before the formation of the V-shaped channels 11. Alternatively, they can be formed after the formation of the first resin layer 9.

In addition, the V-shaped channels 13, which are formed on the backside 7b of the first resin layer 9, are not necessarily formed after the formation of the second resin layer 10. It is simply required that they be formed after the formation of the first resin layer 9 and before the secondary dicing.

As described above, the manufacturing steps of the semiconductor device 1 can be changed in such a way that the V-shaped channels 11 are formed on the backside 2b of the wafer 2; the V-shaped channels 13 are formed in the first resin layer 9; the rewires 5 and the metal posts 6 are formed on the surface 2a of the wafer 2; the dicing channels 12 are formed in a direction from the surface 2a to the backside 2b of the wafer 2; the second resin layer 10 is formed on the backside 2b of the wafer 2; and then, the secondary dicing is performed in a direction from the surface 2a to the backside 2b of the wafer 2. In this case, the surface 2a of the wafer 2 can be subjected to processing after the backside 2b of the wafer 2 is subjected to the aforementioned processes collectively; hence, it is possible to improve the manufacturing efficiency with respect to the semiconductor device 1.

The present invention is not necessarily limited to the semiconductor device 1 described above; hence, it is possible to modify it in a variety of ways within the scope of the invention as defined in the appended claims.

(1) First Variation

Figure 8:
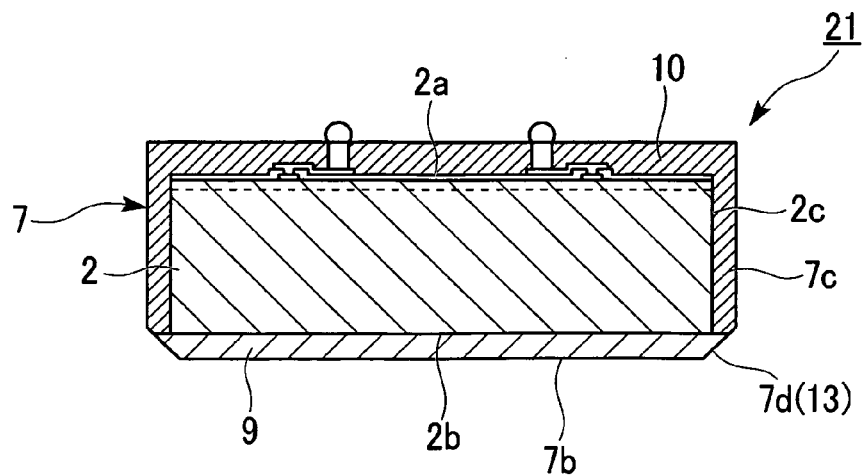
FIG. 8 is a cross-sectional view showing the constitution of a semiconductor device according to a first variation.

The present embodiment is designed in such a way that the slopes 2d are formed at the corners between the backside 2b and the side faces 2c of the substrate 2. FIG. 8 shows a semiconductor device 21 according to a first variation, in which instead of the substrate 2 having the slopes 2d, the resin layer 7 has the slopes 7d. The semiconductor device 21 of the first variation does not need the V-shaped channels 11 formed in the semiconductor device 1 during manufacturing; hence, it is possible to improve the manufacturing efficiency with respect to the semiconductor device 21.

In addition, the semiconductor device 21 has the first resin layer 9, which is formed on the backside 2b of the wafer 2 only. The slopes 7d of the resin layer 7 can be formed in the first resin layer 9 only in the first variation similar to the present embodiment. However, it is preferable that the slopes 7d be formed in both the first resin layer 9 and the second resin layer 10. In the manufacturing of the semiconductor device 21, it is preferable that the V-shaped channels 13 be formed deeply to reach the second resin layer 10. That is, even when an intense impact is applied to the corners between the backside 7b and the side faces 7c of the resin layer 7, it is possible to prevent excessive stress from concentrating at the boundaries between the first resin layer 9 and the second resin layer 10; hence, it is possible to effectively prevent the first resin layer 9 from unexpectedly being separated from the second resin layer 10.

(2) Second Variation

Figure 9:
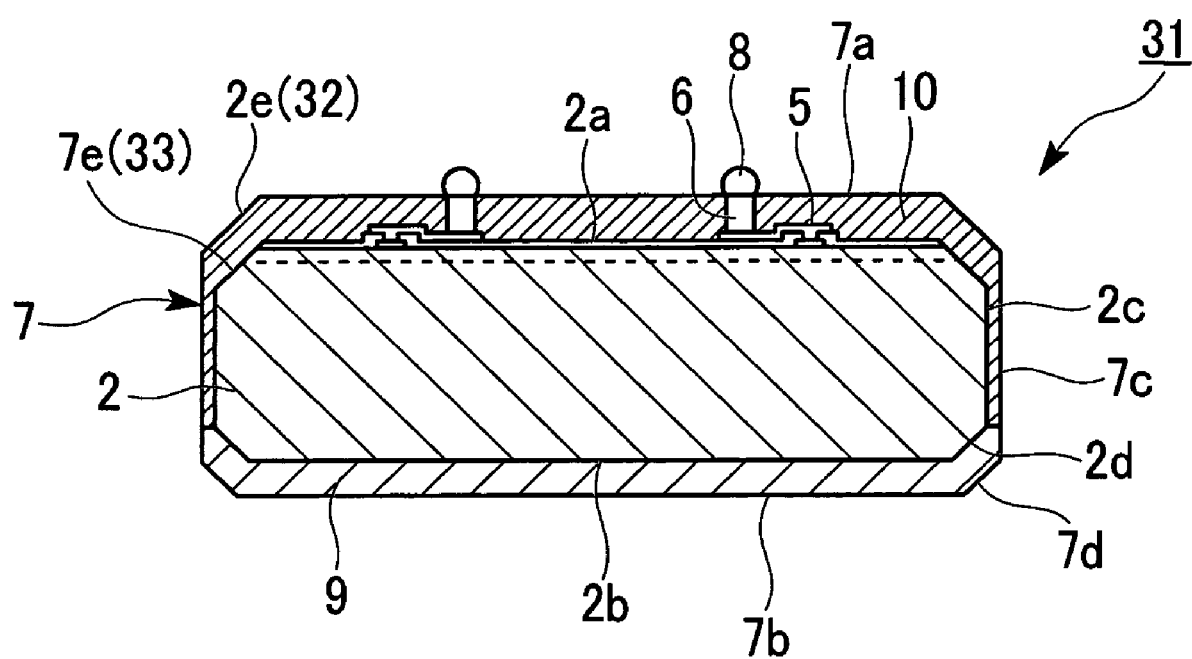
FIG. 9 is a cross-sectional view showing the constitution of a semiconductor device according to a second variation.

Next, a semiconductor device 31 according to a second variation will be described with reference to FIG. 9, wherein parts identical to those used in the semiconductor device 1 shown in FIG. 1 are designated by the same reference numerals; hence, the description thereof will be omitted.

The semiconductor device 31 of the second variation is characterized by forming slopes 7e at the corners between the surface 7a and the side faces 7c of the second resin layer 10 in addition to the slopes 7d formed at the corners between the backside 7b and the side faces 7c of the first resin layer 9.

In addition, slopes 2e are additionally formed at the corners between the surface 2a and the side faces 2c of the substrate 2 in addition to the slopes 2d, which are formed at the corners between the backside 2b and the side faces 2c of the substrate 2. The slopes 2e positioned in proximity to the surface 2a of the substrate 2 are formed in correspondence with the slopes 7e positioned in proximity to the surface 7a of the second resin layer 10, wherein it is preferable that the slopes 2e and 7e be formed in parallel with each other.

The semiconductor device 31 of the second variation can be formed by way of the aforementioned manufacturing method adapted to the semiconductor device 1. Specifically, the slopes 2e positioned in proximity to the surface 2a of the substrate 2 are formed in such a way that V-shaped channels 32 (similar to the V-shaped channels 11 used in the manufacturing of the semiconductor device 1) are formed on the surface 2a of the wafer 2 after the formation of the rewires 5 and the metal posts 6 and before the formation of the dicing channels 12, and then only the center portions of the V-shaped channels 32 lying in width directions are cut out by way of the primary dicing. That is, after the primary dicing, the remaining portions of the V-shaped channels 32 form the slopes 2e positioned in proximity to the surface 2a of the substrate 2.

The slopes 7e positioned in proximity to the surface 7a of the second resin layer 10 are formed in such a way that V-shaped channels 33 (similar to the V-shaped channels 13 used in the manufacturing of the semiconductor device 1) are formed on the surface 7a of the second resin layer 10 after the formation of the second resin layer 10 and before the secondary dicing, and then only the center portions of the V-shaped channels 33 lying in width directions are cut out by way of the secondary dicing. That is, after the secondary dicing, the remaining portions of the V-shaped channels 33 form the slopes 7e positioned in proximity to the surface 7a of the second resin layer 10.

The semiconductor device 31 of the second variation can demonstrate effects similar to the foregoing effects realized by the semiconductor device 1. Due to the formation of the slopes 7e at the corners between the surface 7a and the side faces 7c of the resin layer 7, it is possible to reliably prevent the second resin layer 10 sealing the surface 2a of the substrate 2 from unexpectedly chipping or peeling; hence it is possible to reliably prevent the rewires 5 and the metal posts 6 from being exposed to the exterior and from being damaged. This makes it easy to handle the semiconductor device 31 during transportation and during installation into an electronic device, for example. Thus, it is possible to realize high-speed transportation and high-speed installation.

The semiconductor device 31 of the second variation is designed in such a way that the slopes 2e are formed in proximity to the surface 2a of the substrate 2; but this is not a restriction. That is, only the slopes 7e can be formed in proximity to the surface 7a of the second resin layer 10.

The semiconductor device 31 of the second variation is designed in such a way that the slopes 7d are formed on the backside 7b, and the slopes 7e are formed on the surface 7a; but this is also not a restriction. That is, only the slopes 7e can be formed in proximity to the surface 7a of the second resin layer 10.

Lastly, it is possible to realize further modifications and further variations within the scope of the invention as defined in the appended claims.

What is claimed is:

1. A manufacturing method of a semiconductor device, in which a wafer is provided having a surface, on which a plurality of integrated circuits are formed and electrically connected to a plurality of rewires via a plurality of pad electrodes, and in which a plurality of electrode terminals are formed on the plurality of rewires, and then the wafer is divided into a plurality of individual pieces, said manufacturing method comprising the steps of:

forming a first resin layer for sealing a backside of the wafer before formation of the rewires and the electrode terminals or after the formation of the rewires and the electrode terminals;

performing primary dicing on the surface of the wafer toward the backside of the wafer after the formation of the rewires and the electrode terminals and after formation of the first resin layer so that the first resin layer is partially cut out, thus forming a plurality of dicing channels partitioning the plurality of integrated circuits;

forming a second resin layer for continuously sealing the plurality of dicing channels and the surface of the wafer after formation of the plurality of dicing channels;

dicing the backside of the wafer so as to form a plurality of V-shaped channels in the first resin layer after the formation of the first resin layer and after formation of the second resin layer in such a way that the plurality of V-shaped channels overlap with the plurality of dicing channels in a thickness direction of the wafer; and performing secondary dicing on the surface of the wafer such that the second resin layer sealing side faces of the wafer subjected to partitioning due to the primary dicing still remains and such that the plurality of V-shaped channels partially remain so as to form a plurality of slopes, which are inclined from a backside of the first resin layer sealing the backside of the wafer, thus dividing the wafer into the plurality of individual pieces.

2. The manufacturing method adapted to a semiconductor device according to claim 1, wherein a plurality V-shaped channels are further formed in the backside of the wafer before the formation of the first resin layer so as to overlap with the plurality of V-shaped channels formed in the first resin layer in a thickness direction of the wafer, and wherein the plurality of V-shaped channels formed in the backside of the wafer are sealed with the first resin layer together with the backside of the wafer.

3. The manufacturing method adapted to a semiconductor device according to claim 1, wherein a plurality of V-shaped channels are formed in the second resin layer by way of dicing performed on the surface of the wafer so as to overlap with the plurality of dicing channels after the formation of the second resin layer and before the secondary dicing, and wherein the plurality of V-shaped channels formed in the second resin layer partially remains by way of the secondary dicing, thus forming a plurality of slopes that are inclined from the surface of the second resin layer sealing the surface of the wafer.

4. The manufacturing method adapted to a semiconductor device according to claim 2, wherein a plurality of V-shaped channels are formed in the second resin layer by way of dicing performed on the surface of the wafer so as to overlap the plurality of dicing channels after the formation of the second resin layer and before the secondary dicing, and wherein the plurality of V-shaped channels formed in the second resin layer partially remains by way of the secondary dicing, thus forming a plurality of slopes that are inclined from the surface of the second resin layer sealing the surface of the wafer.

* * * * *